United States Patent [19]
Soenen et al.

[11] Patent Number: 5,671,183
[45] Date of Patent: Sep. 23, 1997

[54] METHOD FOR PROGRAMMING PERMANENT CALIBRATION INFORMATION AT FINAL TEST WITHOUT INCREASING PIN COUNT

[75] Inventors: Eric G. Soenen, Plano; Henry Tin-Hang Yung, Richardson; Michiel deWit, Dallas, all of Tex.

[73] Assignee: Texas Instruments Incorporated, Dallas, Tex.

[21] Appl. No.: 366,064

[22] Filed: Dec. 29, 1994

[51] Int. Cl.⁶ .............................. G11C 7/00; G01R 31/28
[52] U.S. Cl. ................. 365/189.12; 365/201; 365/225.7; 365/226; 371/22.2
[58] Field of Search ..................... 365/233, 189.12, 365/225.7, 96, 201, 226; 371/22.2

[56] References Cited

U.S. PATENT DOCUMENTS

| | | | |
|---|---|---|---|
| 4,855,954 | 8/1989 | Turner et al. | 365/233 |
| 5,235,335 | 8/1993 | Hester et al. | 341/172 |
| 5,353,028 | 10/1994 | deWit et al. | 341/172 |

*Primary Examiner*—David C. Nelms
*Assistant Examiner*—Trong Phan
*Attorney, Agent, or Firm*—Robby T. Holland; Wade James Brady, III; Richard L. Donaldson

[57] ABSTRACT

A System and method for calibrating a chip after packaging including providing a packaged chip, providing programmable non-volatile storage having a plurality of non-volatile storage elements in the chip and providing a volatile storage having a plurality of volatile storage elements in the chip with one volatile storage element associated with one non-volatile storage element. The chip includes circuitry responsive to a predetermined signal to permit the non-volatile storage to be programmed in accordance with data stored in the volatile storage and to a predetermined signal to prevent external alteration of the non-volatile storage. The non-volatile storage is preferably a plurality of fuses. The volatile storage is preferably a shift register. The circuitry in the chip includes a bistable device responsive to the predetermined signal to assume a first condition to permit the non-volatile storage to be programmed and responsive to the alteration of the predetermined signal to assume a second condition which does not allow alteration of data. The system further includes a non-volatile storage element settable to one of a first or a second condition and preset to the first condition, the circuitry in the chip responsive to the first condition to permit the non-volatile storage to be programmed in accordance with data stored in the storage and responsive to the second condition to prevent external alteration of the non-volatile storage. The condition of the non-volatile element determines whether or not the first state (program) of the bistable device can be entered.

22 Claims, 2 Drawing Sheets

METHOD FOR PROGRAMMING PERMANENT CALIBRATION INFORMATION AT FINAL TEST WITHOUT INCREASING PIN COUNT

BACKGROUND OF THE INVENTION

1. Field of the Invention

This invention relates to a system and method for option selection and/or calibrating and/or trimming of components in a semiconductor device and, more specifically, to such a system and method which can be performed at completion of integrated circuit chip fabrication, particularly after packaging, without requiring an increase in the number of pins.

2. Brief Description of the Prior Art

Many integrated circuits require calibration, trimming or option selection before they can be released for sale to a customer. In particular, this is true for precision analog circuitry that requires trimming of some parameters to counteract random process variations. This requirement is also applicable to systems that contain a large number of the same circuit (e.g. memories), where "bad" sections can be selectively by-passed and replaced by functional spares and is useful in cases where several possible functional variations ("options") are available on a single die design with one variation being preselected, such parts often being sold to different customers, sometimes under different part numbers. In other cases (e.g. security applications), it may be necessary to program a unique identification code into each circuit.

The main problem encountered in handling such matters is the difficulty in programming such information after an integrated circuit has been packaged. After packaging, internal circuitry usually is no longer accessible unless dedicated pins are provided. Such dedicated pins waste die and board area and create confusion (it is usually not desirable that a customer be able to alter calibration information). The other option is to program calibration information before packaging. The disadvantage of this solution is that parameters may change during further fabrication and/or packaging after programming. In fact, the packaging process itself may cause drift in parameters (or failure of a section of the chip) which cannot be counteracted at final test.

A further problem is the ability to disable the test mode after the calibration data has been programmed. This is necessary to avoid the possibility that a customer may accidentally or intentionally corrupt or even simply read the calibration data (in the case of, for example, security applications). Exiting the test mode results in a paradox comparable to one leaving a house while locking the door with the only key inside.

SUMMARY OF THE INVENTION

In accordance with the present invention, there is provided a procedure whereby the above noted problems are overcome and wherein a die can be calibrated and/or options selected after packaging and with the die then being rendered unavailable for further calibration.

The above is accomplished using digital information (a number of "bits") to trim or select certain circuitry. The bits are electrically programmed in a non-volatile medium, such as, for example, fuses, EPROMs, EEPROMs, anti-fuses, etc. An arbitrary number of such bits can be accessed and programmed at final test after packaging, using a special "test mode". To operate the test mode, a limited number of integrated circuit pins perform a dual function (normal operation and test mode). Many architectures are possible, depending upon (1) the number of integrated circuit pins which will be involved in the test mode, three pins being the minimum, (2) whether it will be necessary to "try out" the calibration information before making it permanent and (3) whether the calibration information must be read back to verify correct programming.

Disabling of the test mode is achieved through the use of one "key" bit which is, for example, position 64 of the shift register which has 65 positions numbered from 0 to 64. As long as the "key" bit is blank (unprogrammed) or set to a "1" or a "0", as predetermined, the test mode can be accessed. Programming the "key" bit to the complement of the test mode access value (i.e., a "0" or a "1") permanently disables (locks out) the test mode. The preferred scheme uses a state flip-flop to determine whether or not the circuit is in the test mode. This offers an ideal procedure for a final exit. Programming of the "key" bit is possible while in the test mode with the test mode continuing until completion. However, after exiting the test mode, re-entry is prevented.

DESCRIPTION OF THE PREFERRED EMBODIMENT

Figure 1:
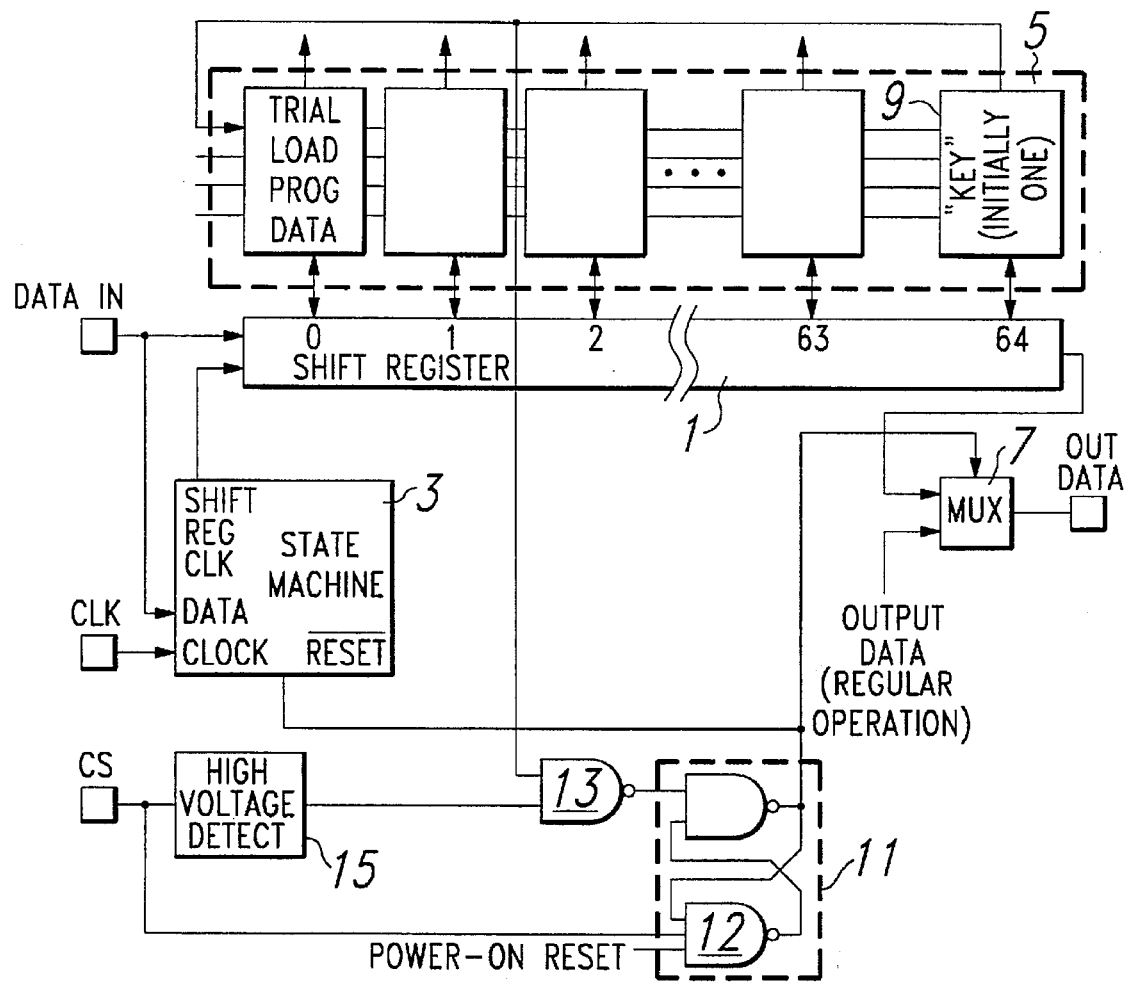
FIG. 1 is a block diagram of a calibration system in accordance with the present invention.

With reference to FIG. 1, the above described functions, such as operating the circuit, entering "try" bits, operating the circuit again, programming the bits permanently and checking the programming, are preferably performed by using a serial shift register 1 for the data and a state machine 3, described in detail with reference to FIG. 2, for control of the operation of the shift register.

The circuit includes a calibratable non-volatile storage medium 5 having plural bit positions, each of the bit positions coupled to a bit position of the serial shift register 1. The storage elements of the storage medium 5 are preferably fuses. The shift register 1 is clocked by clock pulses from the state machine 3. Data is input from a Data In pin to the shift register 1 at a first end thereof and to the state machine 3 and data is output from the other end of the shift register during test mode through a multiplexer 7 responsive to whether the system is in the test mode or in regular operation and then sent to a Data Out pin. The Data In pin and the Data Out pin can be used for other purposes as well as for data input and output when the system is not in the test mode.

In the test mode, the Data In pin is used to clock data into the shift register 1 and the Data Out pin is used to clock the data out from the shift register for inspection of the state of the fuses in the storage medium 5 on the chip. A clock (CLK) pin is used to synchronize shifting in the shift register 1 via the state machine 3 as well as to clock the state machine. The clock pulses to the shift register are not necessarily a mirror of the clock pulses from the CLK pin, the state machine being able to modify the clock pulses to the shift register. This modification is provided by the Data In and CLK pins being used to change the state of the state machine. The state change in the preferred embodiment occurs on each rising edge of a clock pulse from the CLK pin and depends upon the data on the Data In pin. In some states, the shift register is advanced by one position on each falling edge of the clock pulse thereto as explained hereinbelow.

The desired functions to be performed by the system are as follows:

1. To load data into the shift register 1 and fill the shift register. Once this is done, this data is used as prior data for the subsequent calibration. The best data for maximum linearity is being sought.

2. Copy the data from the shift register 1 into non-volatile cells (fuses) 5 to condition the fuses to permanently store a one or a zero or to condition either one of a "1" or "0" fuse, as the case may be. The signals labeled "load", "program" and "data" are generated by the state machine 3 and run through each bit of the shift register 1. The "data" line indicates whether a "1" or a "0" is to be programmed. When the "trial" line from the key fuse 9 (FIG. 1) is high, then the input of the shift register 5 is high, and the calibration data is taken from the volatile shift register rather than from the non-volatile fuses.

Figure 3:
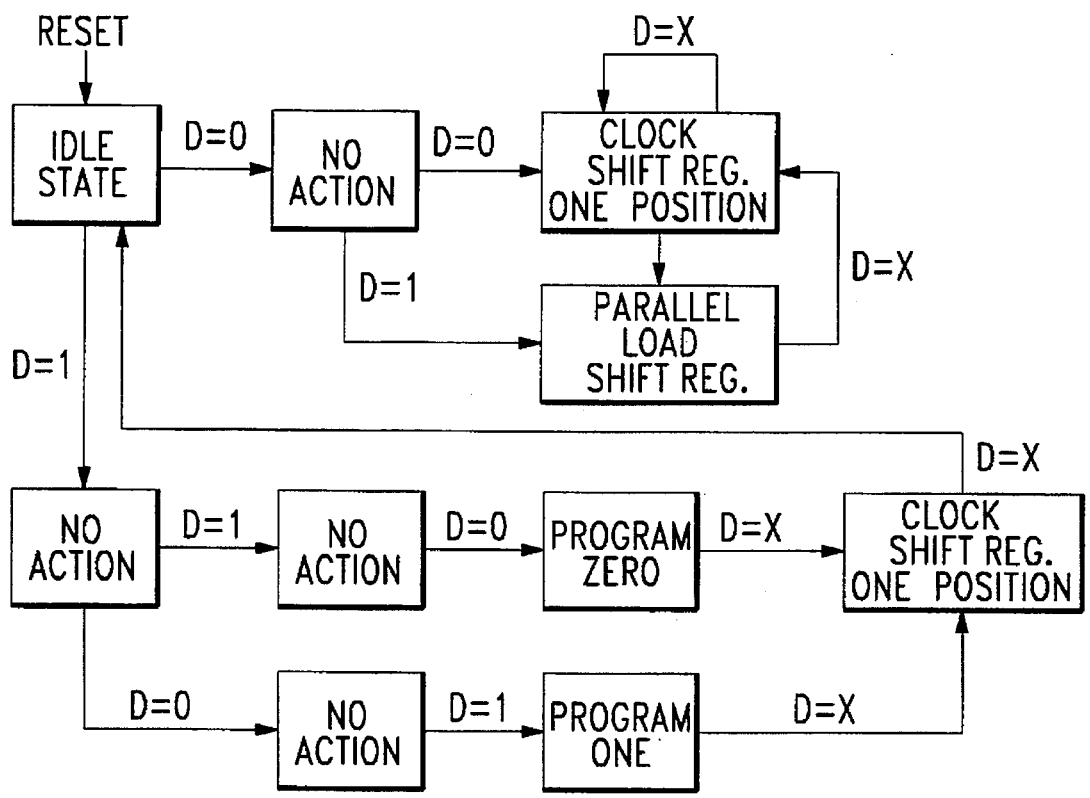
FIG. 3 is a state diagram for the test mode in accordance with the present invention.

The "load" line is high when the state machine is in the state labeled "PARALLEL LOAD SHIFT REG" (FIG. 3). A logic one causes the shift register 1 to be parallel loaded with the fuse data at that time. With reference to the "load" signal from the state machine, data can be shifted into the shift register 1 from two sources, these being from the Data In pin and from the non-volatile memory 5. For a regular load, when the "load" signal is low, data is shifted into the shift register 1 serially and moved along therein for every clock pulse from the state machine in standard manner. When data is to be downloaded from the fuses 5 to the shift register 1 so that such data can be clocked out and checked, this is called "parallel load" and this function is provided when the "load" signal at the state machine is high. The loading operation occurs on the next falling edge of the CLK signal.

The "program" line is used to control the programming of the fuses. When the program line goes high, a "1" or a "0" is written permanently into each fuse cell (or fuse bit) for which the corresponding bit location in the shift register contains a logic "1". Whether a "1" or "0" is written depends upon the state of the "data" line. The "program" line is high whenever the state machine is in the state labeled "PROGRAM ONE" (FIG. 3) or in the state labeled "PROGRAM ZERO" (FIG. 3). In the "PROGRAM ONE" state, the "data" line is made logic high and in the "PROGRAM ZERO" state, the "data" line is logic low. Whenever the "program" line is high, a logic one or a logic zero (depending on the status of the "data" line) is written into each fuse cell whose corresponding shift register bit is set to a logic one at that time. The shift register is used to indicate which fuse(s) to modify.

When "the trial" line is low, this being after everything has been properly programmed, then the data is taken from the non-volatile memory or fuses 5 rather than from the shift register.

The value of the "key" bit (1 or 0) at shift register element 9 is fed to a state flip flop 11 via a NAND gate 13. When a chip select (CS) signal is provided and raised to a high voltage above that of the system power supply, this being an abnormal mode of operation, a high voltage detect circuit 15 recognizes this high voltage and also provides a high signal to the NAND gate 13. The high output of the detect circuit 15 and the "1" or high state of the "key" shift register element 9 provide a low output from NAND gate 13 which sets the flip flop 11 to the test mode, causing activation of the state machine 3 and placing the multiplex circuit 7 into the test mode whereby the multiplex circuit only passes signals from the shift register 1. It can be seen that if the "key" fuse 9 were zero, the output of the NAND gate 13 would be a "1" and the flip-flop 11 would never again be set into the test mode. It follows that the only way to be in the test mode is when the "key" bit 9 is a "1". Once the "key" bit 9 goes to "0" the chip can never return to the test mode once it leaves that mode. The flip-flop 11 can theoretically come on in any state when power is turned on. The flip-flop 11 is prevented from coming on in the test mode by a power-on reset circuit. The power-on reset circuit is not shown in the figure but the output of that circuit is shown as "power-on reset". Whenever the "power-on reset" line is low, the flip-flop is reset to non-test mode.

To enter the test mode, since the "key" bit 9 is initially high (one), when the chip select (CS) pin is momentarily placed at high voltage above the supply voltage and provides a high signal via detect circuit 15, flip-flop 11 is set, provides a high signal on the "test" line and places the circuit in test mode as discussed hereinabove. When the chip select (CS) pin then goes low, the flip-flop 11 goes back to a low signal and the test mode is then locked out. A logic low on the CS pin resets the flip-flop to non-test mode ("test" low) because a logic low on the input of the three-input NAND gate 12 causes its output to be high. The last fuse is blown in a manner identical to all other 64 fuses (using the state machine to activate the operation and using a "1" in the last position of the shift register to select that particular fuse).

Figure 2:
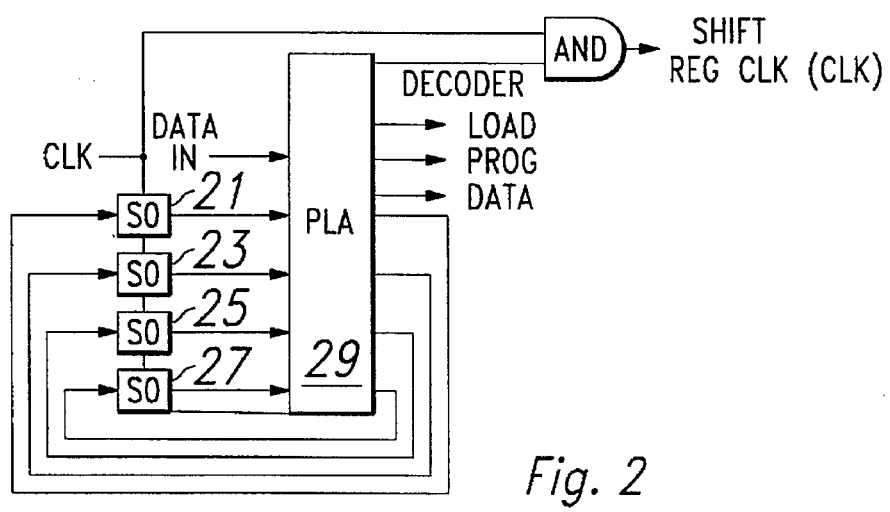
FIG. 2 is a block diagram of the state machine of FIG. 1 in accordance with the present invention.

With reference to FIG. 2, the state machine 3 uses the clock signal at the CLK pin and the signal on the Data In pin. The state machine is controlled on the rising edge of the clock signal pulse and data is shifted in the shift register 1 on the falling or trailing edge of the clock pulse. This is for the purpose of using as few pins as possible. The state machine is comprised of a number of flip-flops 21, 23, 25 and 27 and a programmable logic array (PLA) 29. The state machine 3 implements a state diagram as shown in FIG. 3 which is a well known technique. Initially, the state machine 3 is reset to an idle state or reset state. For each positive excursion of the clock input thereto, on the leading edge of the clock pulse or low to high side of the pulse there will be a transition in the state diagram, depending upon the status of the Data In pin. D=X in FIG. 3 means a path will always be taken, irrespective of the data, whereas D=0 means the path is taken when "data" is logic zero at the time of the clock transition and D=1 means the path is taken when "data" is logic one at the time of the clock transition.

The initial operation is placing the state machine in the idle state (or "reset"). With reference to FIG. 3, this is accomplished by first providing a zero on the chip select (CS) pin to reset the state flip-flop 11 in the normal (non-test) mode and initialize the state machine. Then, the test mode is entered by bringing the CS pin above the supply. The next operation is clocking in data. This is accomplished by providing a zero on the Data In pin at the time of the first rising edge on a CLK signal to place the state machine in a "no action" state. Then, another zero on the next rising edge of a CLK signal places the state machine in the state indicated by the "CLOCK SHIFT REG ONE POSITION". As long as the state machine is in this state, the status of the Data In pin is shifted into the shift register on each falling edge of the CLK signal. The state machine stays in this state irrespective of the status of the Data In pin during subsequent rising edges on the CLK signal. The only way to leave this state is to reset the state machine by momentarily leaving the test mode (bringing the CS pin low), which brings the state back to "idle state". The length of the shift register is arbitrary, it being 64 bits plus a "key" bit in the preferred embodiment. Once the desired number of bits has been clocked into the shift register, the signal on the chip select (CS) pin returns to zero.

For a parallel load, that is, copying the data from the fuses 5 into the shift register 1, a zero signal from the Data In pin and a rising edge on a CLK signal followed by a one signal from the Data In and rising edge on a CLK signal provides the parallel load mode to the shift register. The following falling edge on a CLK signal moves all data from the fuses 5 into the shift register in parallel. Subsequent leading edges of CLK pulses move the data out from the shift register to the data output.

To condition (e.g., blow) the fuses 5, it is desired to condition only one fuse at a time because some known current is required to condition each fuse and the current capability of the circuit may be exceeded if all or several fuses were to be conditioned at once, thereby possibly destroying the part. This is accomplished by placing all zeros in the shift register 1 except for one location, this being the location to be programmed. Then the system is placed into one of the modes entitled "PROGRAM ZERO" (by providing from a "1" from Data In and a CLK signal followed by a "1" followed by a "0" or "PROGRAM ONE" (by providing from a "1" from Data In and a CLK signal followed by a "1" followed by a "1") wherein the program line from the state machine is either high or low. Therefore, the shift register 1 indicates which bit to condition and the "PROGRAM ZERO" or "PROGRAM ONE" state indicates whether the fuse is to be conditioned as a one or a zero. This arrangement requires that two consecutive bits be incorrect in order to make an error in conditioning a fuse. After the zero or one has been programmed in a fuse 5, a clock pulse is provided to shift the shift register by one position. This permits placing a one in the first ("0") position and then shifting the one along the shift register to program each position of the shift register, one bit at a time. When this operation is completed, the "key" bit 9 and state flip-flop 11 are utilized to lock out the test mode. As long as the "key" bit (last fuse) 9 is high, the output of NAND gate 13 can be made low. This occurs when a high voltage is placed on the CS pin and sets the RS type flip-flop (two NAND gates) 11 to "test" mode. When the key bit 9 is low, the output of NAND gate 13 is always high and the test mode cannot be entered (only maintained).

The state machine 5 provides ten states as shown in FIG. 3, this meaning that at least four state variables (ones or zeros) represented in the state machine by data flip-flops 21, 23, 25 and 27 of FIG. 2 are required to identify these ten states. The state variables as well as one external Data In pin and a clock input pin (CLK) enter a programmable logic array (PLA) 29. Depending upon the current state of the flip-flops 21, 23, 25 and 27 and the state of the signal of the Data In pin, the PLA 29 provides four output values which are fed back to the flip-flops and generate the next state. The PLA 29 also has a Shift Reg Clk (CK) output for applying clock pulses to the shift register and a Load (LD) output, the purpose of which is to shift the shift register contents by one position or parallel load the shift register 1. The clock pulses to the shift register are derived using a decoder (see FIG. 2) to detect when the state machine is in any of the states 2 (CLOCK SHIFT REG ONE POSITION), 3 (PARALLEL LOAD SHIFT REG) or 7 (CLOCK SHIFT REG ONE POSITION). The output of this decoder is combined with the inverted version of the CLK signal, using an AND gate (see FIG. 2). The output of the AND gate is used to clock the shift register (edge triggered type). Therefore, whenever state 2, 3 or 7 is currently active and a falling edge is supplied on the CLK pin, the shift register 1 shifts exactly one bit position. All of the flip-flops 21, 23, 25 and 27 have a common clock input which is externally generated. Therefore, each rising edge of a clock pulse (CLK) causes shifting of the data flip-flops 21, 23, 25 and 27. It follows that the state machine is driven by the rising edges of the clock pulses (CLK) and generates the control signals for the shift register 1 which shifts on the falling or trailing edges of the clock pulses.

It can be seen that there has been provided a system and method wherein calibration can be performed after packaging with pins being capable of operating in conjunction with plural functions and with calibration being locked out after completion.

Though the invention has been described with respect to a specific preferred embodiment thereof, many variations and modifictions will immediately become apparent to those skilled in the art. It is therefore the intention that the appended claims be interpreted as broadly as possible in view of the prior art to include all such variations and modifications.

We claim:

1. A calibratible integrated circuit, comprising:
   a programmable non-volatile storage means having a plurality of non-volatile storage elements;
   a data storage means having a plurality of data storage elements, one said data storage element associated with one said non-volatile storage element; and
   means responsive to a predetermined signal to permit said non-volatile storage means to be programmed in accordance with data stored in said data storage means and responsive to alteration of said predetermined signal to prevent alteration of said non-volatile memory.

2. The system of claim 1 wherein said non-volatile storage means is a plurality of fuses.

3. The system of claim 1 wherein said data storage means is a shift register.

4. The system of claim 2 wherein said data storage means is a shift register.

5. The integrated circuit of claim 1 wherein said means responsive to a predetermined signal comprises a bistable device responsive to said predetermined signal to assume a first condition to permit said non-volatile storage means to be programmed and responsive to alteration of the first condition to assume a second unalterable condition.

6. The integrated circuit of claim 2 wherein said means responsive to a predetermined signal comprises a bistable device responsive to said predetermined signal to assume a first condition to permit said non-volatile storage means to be programmed and responsive to alteration of the first condition to assume a second unalterable condition.

7. The integrated circuit of claim 3 wherein said means responsive to a predetermined signal comprises a bistable device responsive to said predetermined signal to assume a first condition to permit said non-volatile storage means to be programmed and responsive to alteration of the first condition to assume a second unalterable condition.

8. The integrated circuit of claim 4 wherein said means responsive to a predetermined signal comprises a bistable device responsive to said predetermined signal to assume a first condition to permit said non-volatile storage means to be programmed and responsive to alteration of the first condition to assume a second unalterable condition.

9. The integrated circuit of claim 1 further including a non-volatile storage element settable to one of a first or a second condition and preset to said first condition, said means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

10. The integrated circuit of claim 2 further including a non-volatile storage element settable to one of a first or a second condition and preset to said first condition, said means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

11. The integrated circuit of claim 3 further including a non-volatile storage element settable to one of a first or a second condition and preset to said first condition, said means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

12. The integrated circuit of claim 4 further including a non-volatile storage element settable to one of a first or a second condition and preset to said first condition, said means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

13. A method of calibrating an integrated circuit which comprises the steps of:

provided programmable non-volatile storage means having a plurality of non-volatile storage elements;

providing data storage means having a plurality of data storage elements, one said data storage element associated with one said non-volatile storage element;

permitting said non-volatile storage means to be programmed in accordance with data stored in said data storage means responsive to a predetermined signal; and preventing alteration of said non-volatile memory in response to alteration of said predetermined signal.

14. The method of claim 13 wherein said step of providing a non-volatile storage means comprises providing a plurality of fuses.

15. The method of claim 13 wherein said step of providing data storage means comprises the step of providing a shift register.

16. The method of claim 14 wherein said step of providing data storage means comprises the step of providing a shift register.

17. The method of claim 13 further including the step of providing a non-volatile storage element settable to one of a first or a second condition and preset to said first condition, and providing means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

18. The method of claim 14 further including the step of providing a non-volatile storage element settable to one of a first or a second condition and preset to said first condition, and providing means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

19. The method of claim 15 further including the step of providing a non-volatile storage element settable to one of a first or a second condition and preset to said first condition, and providing means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

20. The method of claim 16 further including the step of providing a non-volatile storage element settable to one of a first or a second condition and preset to said first condition, and providing means responsive to said predetermined signal and said first condition to permit said non-volatile storage means to be programmed in accordance with data stored in said data storage means and responsive to alteration of said predetermined signal and alteration of said first condition to said second condition to prevent alteration of said non-volatile memory.

21. A method of calibrating an integrated circuit and then preventing further calibration which comprises the steps of:

(a) providing an integrated circuit having a plurality of external electrical contacts, at least one of said contacts having dual usage;

(b) providing circuitry on said integrated circuit initially preset in a first state to allow calibration via said electrical contacts and responsive to a predetermined signal on said at least one of said dual usage electrical contacts to permanently set said circuitry to prevent further calibration via said electrical contacts.

22. The method of claim 21 wherein said integrated circuit has two dual usage electrical contacts, said dual usage electrical contacts being functional in the operation of said integrated circuit to perform a function in addition to the permanent setting of said circuitry.

* * * * *